US007091814B2

(12) United States Patent
Kyriazidou

(10) Patent No.: US 7,091,814 B2
(45) Date of Patent: Aug. 15, 2006

(54) ON-CHIP DIFFERENTIAL MULTI-LAYER INDUCTOR

(75) Inventor: Chryssoula Kyriazidou, Santa Monica, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/727,431

(22) Filed: Dec. 4, 2003

(65) Prior Publication Data
US 2004/0108935 A1 Jun. 10, 2004

(51) Int. Cl.
*H01F 5/00* (2006.01)
(52) U.S. Cl. ...................................... 336/200
(58) Field of Classification Search ................. 336/65, 336/83, 200, 206–208, 223, 232; 29/602.1, 29/605–606
See application file for complete search history.

(56) References Cited

U.S. PATENT DOCUMENTS

| 5,477,204 A | * | 12/1995 | Li | 336/200 |
| 6,396,362 B1 | * | 5/2002 | Mourant et al. | 333/25 |
| 6,476,704 B1 | * | 11/2002 | Goff | 336/200 |
| 6,707,367 B1 | * | 3/2004 | Castaneda et al. | 336/200 |
| 6,759,937 B1 | * | 7/2004 | Kyriazidou | 336/200 |
| 6,801,114 B1 | * | 10/2004 | Yang et al. | 336/200 |
| 2001/0017582 A1 | * | 8/2001 | Sakata | 336/200 |

* cited by examiner

*Primary Examiner*—Tuyen T Nguyen
(74) *Attorney, Agent, or Firm*—Garlick Harrison & Markison; Timothy W. Markison

(57) ABSTRACT

An on-chip differential multi-layer inductor includes a $1^{st}$ partial winding on a $1^{st}$ layer, a $2^{nd}$ partial winding on the $1^{st}$ layer, a $3^{rd}$ partial winding on a $2^{nd}$ layer, a $4^{th}$ partial winding on the $2^{nd}$ layer, and an interconnecting structure. The $1^{st}$ and $2^{nd}$ partial windings on the $1^{st}$ layer are operably coupled to receive a differential input signal. The $3^{rd}$ and $4^{th}$ partial windings on the $2^{nd}$ layer are each operably coupled to a center tap. The interconnecting structure couples the $1^{st}$, $2^{nd}$, $3^{rd}$ and $4^{th}$ partial windings such that the $1^{st}$ and $3^{rd}$ partial windings form a winding that is symmetrical about the center tap with a winding formed by the $2^{nd}$ and $4^{th}$ partial windings. By designing the on-chip differential multi-layer inductor to have a desired inductance value, a desired Q factor, and a desired operating rate, a desired resonant frequency and corresponding desired capacitance value can be determined. Having determined the electrical parameters of the multi layer established, the geometric shapes of the windings, number of windings, number of layers to support the inductor, and the interconnecting structure may be determined.

5 Claims, 6 Drawing Sheets

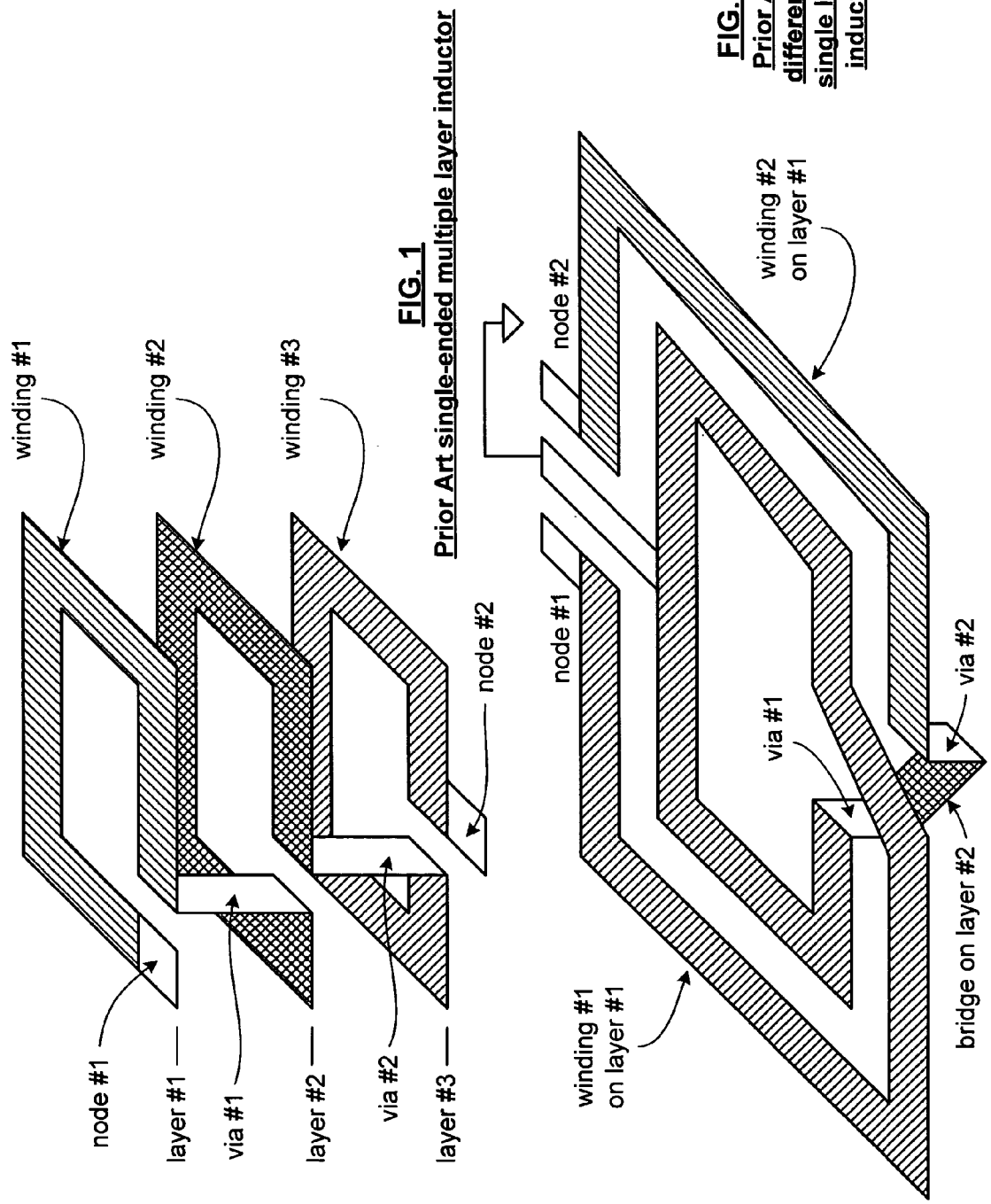

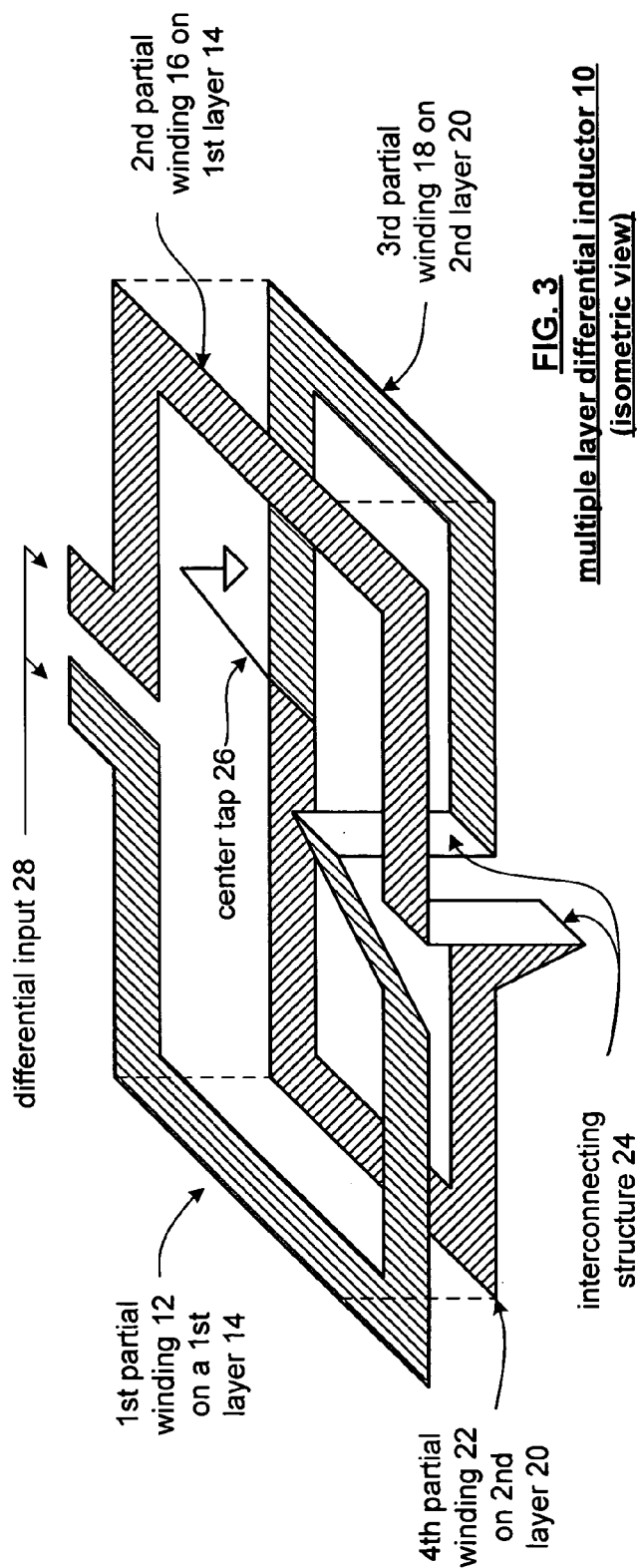
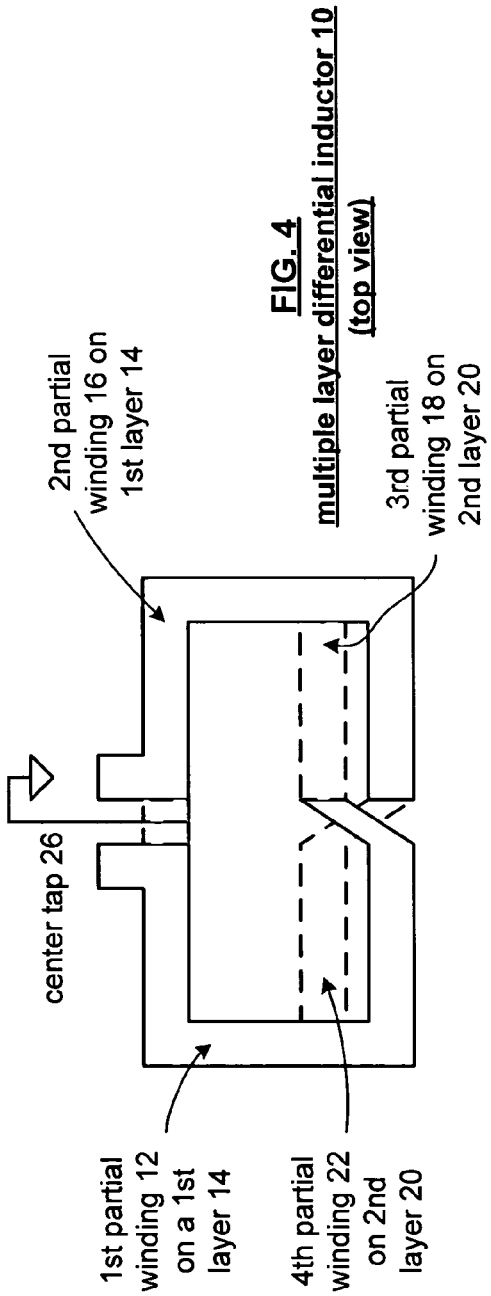
FIG. 3
multiple layer differential inductor 10
(isometric view)
FIG. 4
multiple layer differential inductor 10
(top view)

multiple layer differential inductor 30
(isometric view)

multiple turn multiple layer differential inductor 50

ON-CHIP DIFFERENTIAL MULTI-LAYER INDUCTOR

This patent application is claiming priority under 35 USC § 120 to co-pending patent application entitled ON-CHIP DIFFERENTIAL MULTI-LAYER INDUCTOR having a Ser. No. of 10/161,518 and a filing date of Jun. 3, 2002.

TECHNICAL FIELD OF THE INVENTION

This invention relates generally to integrated circuits and more particularly to on-chip inductors.

BACKGROUND OF THE INVENTION

As is known, wireless communication standards place stringent requirements on wireless communication devices' dynamic range of operation to accommodate for the dramatic variations in signal strength of receive signals, which may vary by orders of magnitude. To meet these requirements, wireless communication devices are designed using radio frequency (RF) integrated circuits (IC) that consume low power and produce little noise. As is also known, on-chip inductors are significant components of RFIC's and are used in oscillators, impedance matching networks, emitter degeneration circuits, filters, and/or baluns. Thus, it is desirable to use on-chip inductors that consume as little power as possible and produce as little noise as possible. In addition, it is desirable to use on-chip inductors that provide a desired inductance value at a desired operating rate consuming as little IC real estate as possible.

To minimize power consumption and to reduce noise, an inductor should have a high quality factor (Q factor). As is known, the Q factor is a measure of an inductor's performance characteristics expressed in power capabilities at a resonant frequency and its selectivity (i.e., power ratio in decibels versus frequency). As is known, CMOS on-chip inductors have a relatively low Q factor in the range of 5–10.

As with any circuit or component implemented on an integrated circuit, the circuit and/or component should be as small as possible (i.e., have as small of an IC footprint as possible) and still be able to achieve the desired performance criteria. In general, on-chip inductors' performance criteria is becoming more and more demanding as the demands for larger inductance values, high Q factors, lower noise levels, higher operating rates, et cetera increase.

FIG. 1 illustrates a single ended multi-layer on-chip inductor, which includes multiple windings (Windings #1–#3) on multiple layers (Layers #1–#3). As shown, the windings are connected by vias (Vias #1 and #2). While such an inductor provides a relatively small footprint and can have higher inductance values than single layer inductors of a similar footprint, it typically has a relatively significant capacitance value that limits the resonant frequency, which in turn limits the operating frequency of the inductor. In addition and as is generally known, single ended circuits are inherently noisier than differential circuits. Thus, for noise sensitive circuits, a differential inductor is often chosen over a single ended inductor.

FIG. 2 illustrates a single layered differential inductor having $1^{st}$ and $2^{nd}$ windings (Windings #1 and #2) on one layer (Layer #1). Winding #1 is coupled to Winding #2 via a bridge on Layer #2 and interconnecting vias #1 and #2. The differential single layered inductor receives a differential signal via nodes 1 and 2. Such a differential inductor has a low capacitance value, but to achieve a large inductance value, it consumes a significant amount of IC real estate. In addition, the differential inductor is not symmetrical because node #1 to ground is all on the first layer and node #2 to ground includes the bridge and the vias, thus it is longer.

Therefore a need exists for a differential inductor that minimizes the use of integrated circuit real estate, can operate at relatively high frequencies, has a relatively high Q factor and a need also exists for a method of design and a method of manufacture for a multi layer differential inductor.

SUMMARY OF THE INVENTION

The on-chip differential multi-layer inductor disclosed herein substantially meets these needs and others. Such an on-chip differential multi-layer inductor includes a $1^{st}$ partial winding on a $1^{st}$ layer, a $2^{nd}$ partial winding on the $1^{st}$ layer, a $3^{rd}$ partial winding on a $2^{nd}$ layer, a $4^{th}$ partial winding on the $2^{nd}$ layer, and an interconnecting structure. The $1^{st}$ and $2^{nd}$ partial windings on the $1^{st}$ layer are operably coupled to receive a differential input signal. The $3^{rd}$ and $4^{th}$ partial windings on the $2^{nd}$ layer are each operably coupled to a center tap. The interconnecting structure couples the $1^{st}$, $2^{nd}$, $3^{rd}$ and $4^{th}$ partial windings such that the $1^{st}$ and $3^{rd}$ partial windings form a winding that is symmetrical about the center tap with a winding formed by the $2^{nd}$ and $4^{th}$ partial windings. By designing the on-chip differential multi-layer inductor to have a desired inductance value, a desired Q factor, and a desired operating rate, a desired resonant frequency and corresponding desired capacitance value can be determined. Having determined the electrical parameters of the multi layer established, the geometric shapes of the windings, number of windings, number of layers to support the inductor, and the interconnecting structure may be determined.

Other embodiments of an on-chip differential multi-layer inductor include parallel partial windings on $3^{rd}$ and $4^{th}$ layers that are operably coupled in parallel (i.e., shunted) with the $1^{st}$, $2^{nd}$, $3^{rd}$ and $4^{th}$ partial windings. In addition, the positioning of the partial windings with respect to the parallel windings and with respect to each other may be positioned to tune the capacitance value of the inductor to set the resonant frequency at a desired value.

In another aspect of an on-chip differential multi-layer inductor, the windings on multiple layers may have similar metalization (i.e., have about the same amount of metal layers). The amount of metalization, the geometric shape of the windings, and the number of layers to use may be determined based on the desired inductance value, desired metalization coverage, and operating rates. By evenly distributing or near evenly distributing metalization amongst the layers, the manufacturing yield of integrated circuits including on-chip inductors is increased.

As such, multiple embodiments of a differential inductor may be designed and manufactured to minimize the use of integrated circuit real estate, to operate at relatively high frequencies, and to have a relatively high Q factor.

BRIEF DESCRIPTION OF THE DRAWINGS

FIG. 1 illustrates a schematic block diagram of a prior art single ended multiple layer inductor;

FIG. 2 illustrates a diagram of a prior art differential single layer inductor;

FIG. 3 illustrates an isometric view of a multiple layer differential inductor in accordance with the present invention;

FIG. 4 illustrates a top view of the multiple layer differential inductor in accordance with the present invention;

DETAIL DESCRIPTION OF A PREFERRED EMBODIMENT

Figure 5:
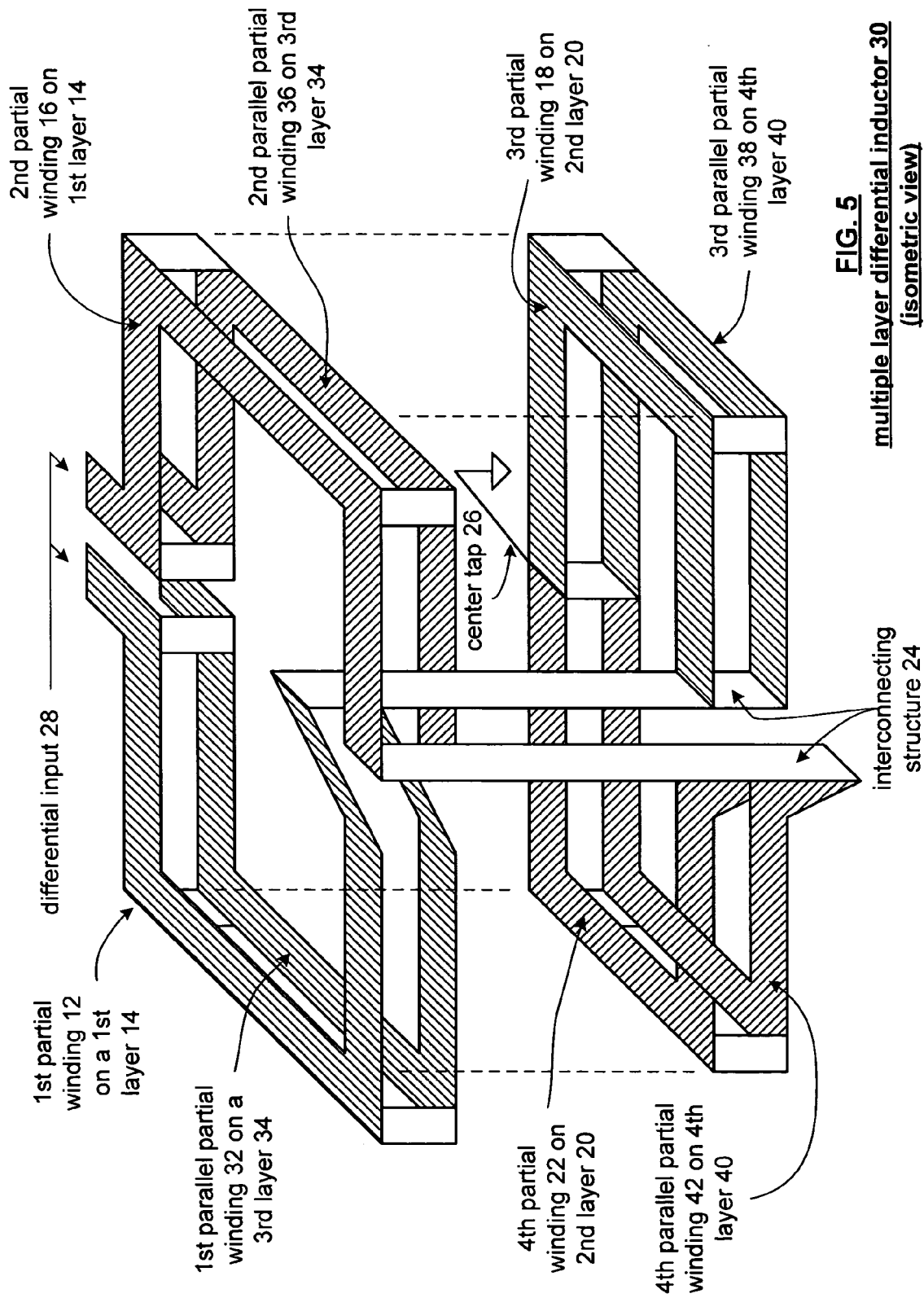
FIG. 5 illustrates an isometric view of another multiple layer differential inductor in accordance with the present invention.

FIG. 3 illustrates an isometric view of a multiple layer differential inductor 10 that includes a $1^{st}$ partial winding 12 on a $1^{st}$ layer 14 of an integrated circuit, a $2^{nd}$ partial winding 16 on the $1^{st}$ layer 14, a $3^{rd}$ partial winding 18 on a $2^{nd}$ layer 20 of the integrated circuit, a $4^{th}$ partial winding 22 on the $2^{nd}$ layer 20, an interconnecting structure 24, and a center tap 26. The $1^{st}$ and $2^{nd}$ partial windings 12 and 16 are operably coupled to receive a differential input 28. As can be seen in FIG. 3, the $1^{st}$ partial winding 12 is coupled to the $3^{rd}$ partial winding 18 by the interconnecting structure 24. Similarly, the $2^{nd}$ partial winding 16 is coupled to the $4^{th}$ partial winding 22 via the interconnecting structure 24. The $4^{th}$ partial winding 22 and the $3^{rd}$ partial winding 18 are both coupled to center tap 26. As configured, the winding formed by the $1^{st}$ partial winding and $3^{rd}$ partial winding 18 is identical (within manufacturing limits) to the winding formed by the $2^{nd}$ partial winding 16 and $4^{th}$ partial winding 22. In particular, the amount of metalization from the differential inputs to the center tap via the $1^{st}$ and $3^{rd}$ partial windings is equal to the amount of metalization of the $2^{nd}$ partial winding 16 and $4^{th}$ partial winding 22. By matching the metalization from the legs of the differential input 28 to the center tap, the differential inductor 10 will be symmetrical in operation.

The interconnecting structure 24 may include a $1^{st}$ set of vias that couple the $1^{st}$ partial winding to the $3^{rd}$ partial winding and a $2^{nd}$ set of vias that couple the $2^{nd}$ partial winding to the $4^{th}$ partial winding. Regardless of the number of vias used, and/or bridges included in the interconnecting structure 24, the $1^{st}$ set is symmetrical to the $2^{nd}$ set. Such symmetry ensures that each winding of the differential inductor will be symmetrical.

In the design of a multi-layer differential inductor, such as the one depicted in FIG. 3, the desired inductance value and the operating frequency are determined in accordance with the circuitry incorporating the differential inductor. The resonant frequency of the inductor may be determined from the required operating rate. In general, the resonant frequency should be at least twice that of the operating frequency. Now having the desired inductance value and required resonant frequency, the required capacitance value may then be ascertained. From these values, the structure of the multiple layer differential inductor may be determined.

In general, integrated circuit manufacture yield increases when the amount of metalization per layer is in the range of 20–80%. Thus, the structure of the multiple layer inductor should use as many layers as possible and the amount of metalization on each layer should be in amounts to achieve the desires 20–80% metalization. In addition, layers that support thicker metalization should be used for higher current windings to minimize the effective impedance, which increases the Q factor. In contrast, integrated circuits that include a single layer differential inductor of the prior art suffer from lower yields since the layers above and/or below the differential inductor were unused. This problem is accentuated as the desired inductance value increases, since it requires an increasing amount of integrated circuit real estate to achieve the desired inductance values. Thus, the amount of unused integrated real estate on other layers increases, which creates a greater metalization imbalance between the layers resulting in decreased yields.

In addition to improving yields by utilizing multiple layers to implement a differential inductor, the integrated circuit footprint of the differential inductor may be decreased while maintaining a desired inductance value. In particular, the inductance value of a multiple layer inductor increases approximately by the square of the number of layers used for the same amount of IC real estate per layer. For example, a single layer inductor that utilizes 4 millimeters by 4 millimeters of integrated circuit real estate will have a $1^{st}$ inductance value. An inductor that utilizes 1 millimeter by 1 millimeter real estate area on 2 layers will have 4 times the inductance of the 1 mm by 1 mm single layer inductor.

While increasing the number of layers reduces the IC footprint and increases the inductance value of an inductor, the parasitic capacitance may be so large that the inductor is unusable at the desired operating rates. To insure that the multiple layer differential inductor is useable at the desired operating frequency, the parasitic capacitance is tuned such that the inductor has a resonant frequency that is at least twice the frequency of the operating rate. Note that by tuning the capacitance such that the resonant frequency is approximately twice the operating frequency, as opposed to being many times greater than the operating frequency, the quality factor of the inductor is increased since the peak of the quality function moves closer to the operating frequency. In one embodiment, the parasitic capacitance may be tuned by varying the distance between the partial windings on one layer and the partial windings on another layer (e.g., skipping a layer), and/or offsetting the partial windings such that they do not lie directly above or below the other partial windings.

While the implementation of the multi-layer differential inductor 10 of FIG. 3 illustrates the same number of windings on each layer, one of average skill in the art will appreciate that each layer may have a different number of turns while maintaining electromagnetic symmetry. In particular, depending on IC technology and area constraints, a higher Q value with smaller areas may be obtained for fixed inductor values by allowing a smaller portion of the inductance to be obtained by a smaller number of turns at thinner metal track levels while the larger portion of the inductance results from thicker metal track levels. As one of average skill in the art will appreciate, such varying of the inductance between thicker and thinner metal tracks can be tailored for any CMOS foundry process.

FIG. 4 illustrates a top view of the multi-layer differential inductor 10. In this illustration, the $1^{st}$, $2^{nd}$, $3^{rd}$ and $4^{th}$ partial windings 12, 16, 18 and 22 are shown more clearly to illustrate the symmetry between the differential inputs and the center tap 26. As one of average skill in the art will appreciate, the multi-layer differential inductor 10 may include more layers and more windings but maintains an electromagnetic symmetry from the differential inputs to the center tap. In addition, the positioning of the partial windings on lower layers may be skewed (i.e., not directly under) the layers on above windings to tune the capacitance values. As such, a differential inductor that minimizes the use of integrated circuit real estate, operates at relatively high frequencies, and has a relatively high Q factor is achieved.

FIG. 5 illustrates a multi-layer differential inductor 30 that includes the $1^{st}$ partial winding 12 on a $1^{st}$ layer 14 shunted (or coupled in parallel) with a $1^{st}$ parallel partial winding 32 on a $3^{rd}$ layer 34. Similarly, the $2^{nd}$ partial winding 16 on the $1^{st}$ layer 14 is shunted with a $2^{nd}$ parallel partial winding 36 on the $3^{rd}$ layer 34. The $3^{rd}$ partial winding 18 on a $2^{nd}$ layer 20 is shunted with a $3^{rd}$ parallel partial winding 38 on a $4^{th}$ layer 40. The $4^{th}$ partial winding 22 on the $2^{nd}$ layer 20 is shunted with a $4^{th}$ parallel partial winding 42 on the $4^{th}$ layer 40. The shunted windings are operably coupled via the interconnecting structure 24. In this implementation, the interconnecting structure includes vias.

If the multi-layer differential inductor 30 is implemented on a six layer integrated circuit, the $1^{st}$ and $2^{nd}$ partial windings may be on a $1^{st}$ layer, the $1^{st}$ and $2^{nd}$ parallel partial windings may be on the next lower layer, the $3^{rd}$ and $4^{th}$ partial windings 18 and 22 may be on the next lower layer and the $3^{rd}$ and $4^{th}$ parallel partial windings may be on the next lower layer. To alter the capacitance of the differential inductor, the $3^{rd}$ and $4^{th}$ partial windings as well as the $3^{rd}$ and $4^{th}$ parallel partial windings may be moved down a layer such that the distance between the shunted $1^{st}$ and $2^{nd}$ parallel partial windings and the $3^{rd}$ and $4^{th}$ shunted partial windings is increased.

As one of average skill in the art will appreciate, other partial windings may be shunted in parallel with the $1^{st}$, $2^{nd}$, $3^{rd}$ and $4^{th}$ partial windings to further increase the metalization use of the integrated circuit. In addition, the number of turns per layer may be increased.

Figure 6:
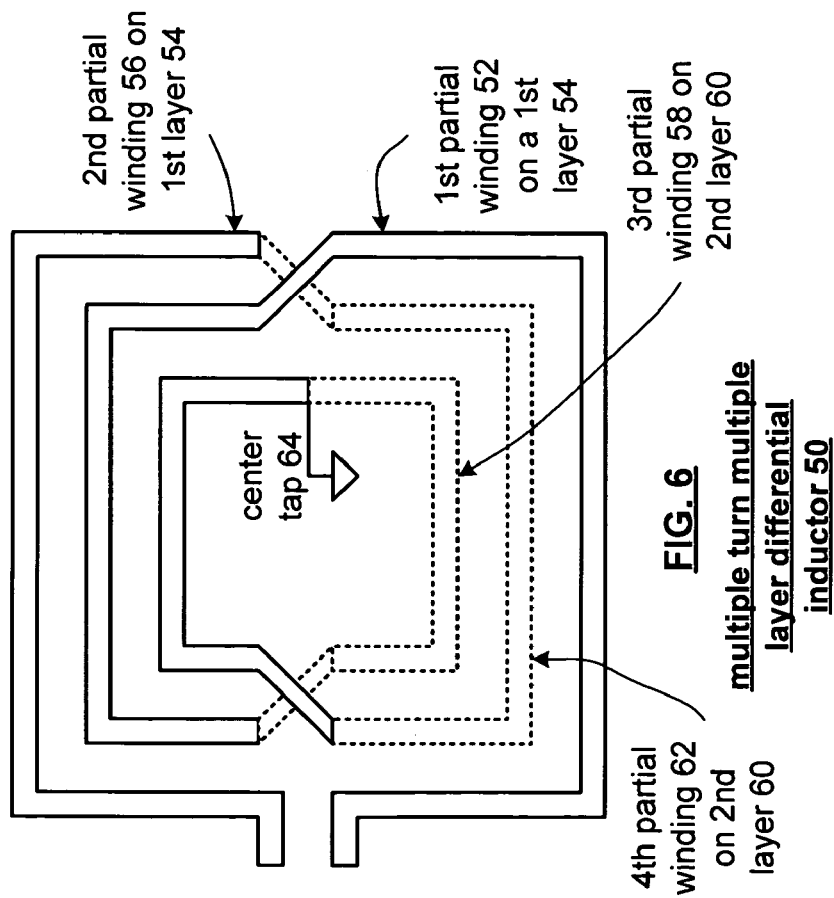
FIG. 6 illustrates a top view of a multiple turn, multiple layer differential inductor in accordance with the present invention.

FIG. 6 illustrates a top view of a multi-turn multiple layer differential inductor 50. In this embodiment, the $1^{st}$ partial winding 52 is on a $1^{st}$ layer 54, the $2^{nd}$ partial winding 56 is on the $1^{st}$ layer 54. The $3^{rd}$ partial winding 58 is on a $2^{nd}$ layer 60 and the $4^{th}$ partial winding 62 is on the $2^{nd}$ layer 60. The center tap 64 may be on the $1^{st}$ or $2^{nd}$ layer 54 or 60. The interconnecting structure connects the partial windings on the $2^{nd}$ layer with the partial windings on the $1^{st}$ layer.

Figure 7:
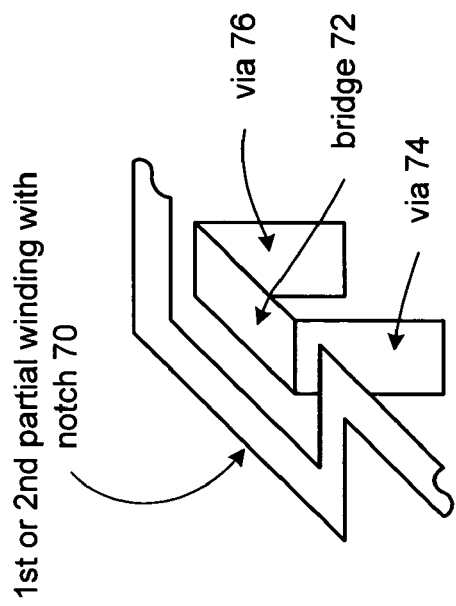
FIG. 7 illustrates a notching of a winding in accordance with the present invention.

FIG. 7 illustrates a graphical representation of notching 70, the $1^{st}$ or $2^{nd}$ partial windings to make room for an interconnecting structure that includes a bridge 72 and vias 74 and 76. By notching a partial winding, a bridge may be used in a position that otherwise would not be available in the design of a multi-turn multiple layer differential inductor.

Figure 8:
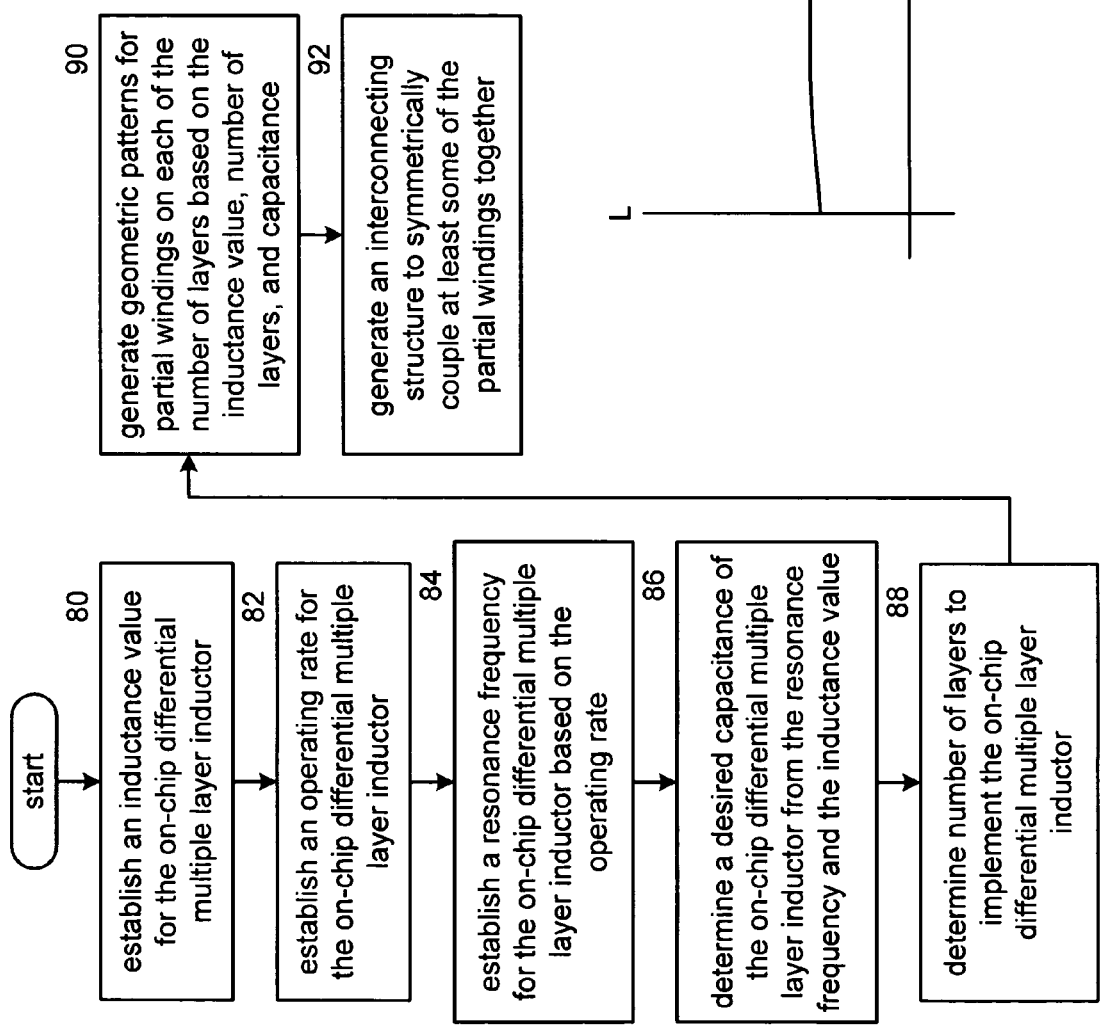
FIG. 8 illustrates a logic diagram of a method for designing a multiple layer differential inductor in accordance with the present invention.

FIG. 8 illustrates a logic diagram of a method for designing an on-chip differential multiple layer inductor. The process begins at Step 80 where an inductance value for the on-chip differential multi-layer inductor is established. The inductance value is dictated by the circuit embodying the differential inductor. The process then proceeds to Step 82 where an operating rate for the differential inductor is established. This too will be dictated by the circuitry embodying the differential inductor.

The process then proceeds to Step 84 where a resonant frequency for the on-chip differential multiple layer inductor is established based on the operating rate. To achieve optimum performance of the inductor, (i.e., highest quality factor, et cetera) the resonant frequency should be approximately twice that of the operating rate.

Figure 9:
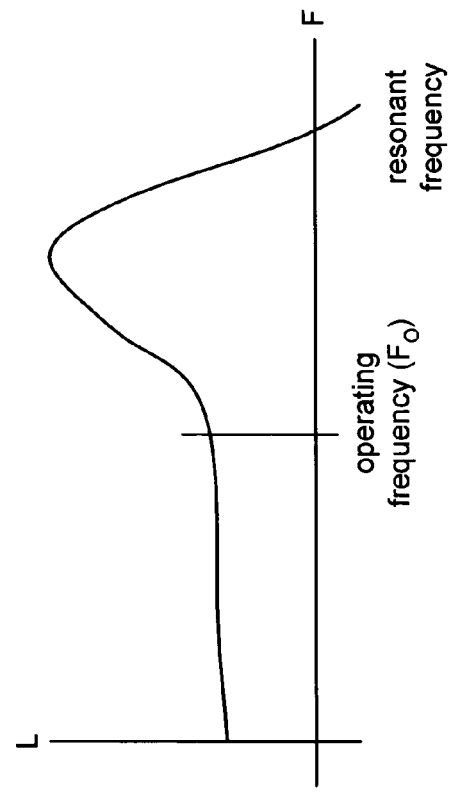
FIG. 9 illustrates a frequency response of a differential inductor.

FIG. 9 illustrates a graph that plots inductance of a differential inductor versus frequency. As shown, as the frequency increases, the inductance value varies and then, at the resonant frequency, the parasitic capacitance dominates the properties of the inductor such that at frequencies above the resonant frequency, the differential inductor functions primarily like a capacitor. For reliable operation, the inductance value, at and around the operating frequency, should be relatively constant but as close to the resonant frequency as possible, which typically occurs at about ½ of the resonant frequency.

Returning to the logic diagram of FIG. 8, the process proceeds to Step 86 where a desired capacitance value (i.e., parasitic capacitance) of the differential inductor is determined from the resonant frequency and the inductance value. The process then proceeds to Step 88 where a number of layers to implement the on-chip inductor is determined. The number of layers will be based on the desired metalization coverage for the various layers, the number of layers available, the desired capacitance value, and the desired amount of integrated real estate consumed per layer.

The process then proceeds to Step 90, where the geometric patterns for partial windings on each of the layers are determined based on the desired inductance value, desired capacitance value, and the number of layers. The geometric patterns may include notches to provide clearance for the interconnecting structure. In addition, the geometric patterns may include shunting of windings and/or coupling windings in series as previously discussed with reference to FIGS. 3–6.

The process then proceeds to Step 92, where an interconnecting structure is generated to symmetrically couple the partial windings to produce the differential inductor. The interconnecting structure may include vias and/or bridges that are sized and positioned to maintain symmetry within a differential inductor.

Figure 10:
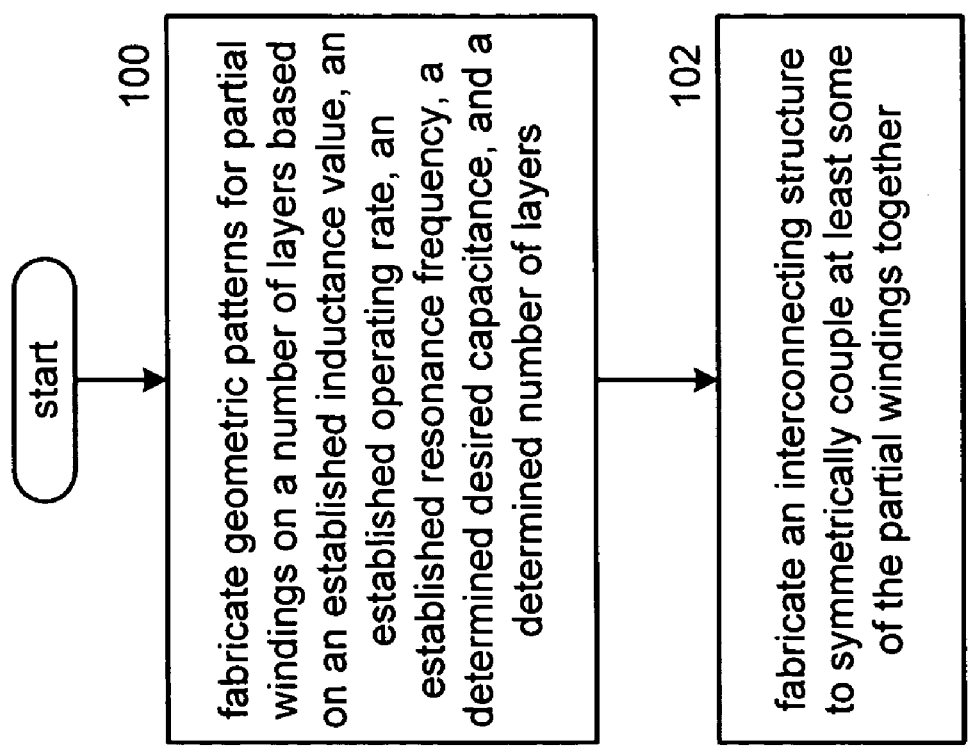
FIG. 10 illustrates a logic diagram of a method for manufacturing a multi-layer differential inductor in accordance with the present invention.

FIG. 10 illustrates a method of manufacturing a differential inductor. The process begins at Step 100, where geometric patterns for partial windings are fabricated on a number of layers, where the patterns are based on an established inductance value, and established operating rate, and established resonant frequency, a determined desired capacitance value and a determined number of layers. The capacitance value is determined based on the established resonant frequency and the established inductance value. The number of layers used is partially based on the desired metalization coverage for each layer. The geometric patterns may include notches in some of the partial windings to provide clearance for the interconnecting structure. In addition, the partial windings on multiple layers may be shunted and/or connected in series to provide the desired inductance values. As previously mentioned, for a given IC real estate area, the inductance value increases by the square of number of layers used when the windings are connected. As such, the multiple layer inductor may be implemented on every layer of an integrated circuit where some of the windings on layers are shunted together and others are connected in series.

The process then proceeds to Step 102, where the interconnecting structure is fabricated to produce symmetrical coupling between the partial windings.

The preceding discussion has presented an on-chip multiple layer differential inductor, a method of design of such an inductor and a method of manufacture of such an inductor. By taking into account the various aspects as mentioned in the method of design, a high performance economical differential inductor may be achieved. As one of average skill in the art will appreciate, other embodiments may be derived from the teaching of the present invention, without deviating from the scope of the claims.

What is claimed is:

1. An on-chip differential multiple layer inductor comprises:
    a first node on a first layer of a plurality of metal layers of an integrated circuit;
    a second node on the first layer; and
    a multi-layer winding on at least some of the plurality of metal layers, wherein the multi-layer winding is coupled to the first and second nodes, wherein the multi-layer winding is symmetrical with respect to the first and second nodes, and wherein metallization of the winding on each of the at least some of the plurality of metal layers is in an approximate range of twenty to eighty percent;
    first partial winding on at least one of the at least some of the plurality of metal layers; and
    second partial winding on at least another one of the at least some of the plurality of metal layers, wherein positioning of the second partial winding with respect to positioning of the first partial winding establishes a parasitic capacitance that, in combination with inductance of the on-chip differential multiple layer inductor, provides a resonant frequency of approximately twice an operating frequency of the on-chip differential multiple layer inductor.

2. The on-chip differential multiple layer inductor of claim 1, wherein the multi-layer winding comprises:
    the at least one of the at least some of the plurality of metal layers is an adjacent metal layer to the at least another one of the at least some of the plurality of metal layers, wherein the positioning of the first partial winding is offset from the positioning of the second partial winding.

3. The on-chip differential multiple layer inductor of claim 1, wherein the multi-layer winding comprises:
    an unused metal layer of the plurality of the metal layers, wherein the unused metal layer is between the at least one of the at least some of the plurality of metal layers and the at least another one of the at least some of the plurality of metal layers, wherein the positioning of the first partial winding is aligned with the positioning of the second partial winding.

4. The on-chip differential multiple layer inductor of claim 1, wherein at least one the plurality of metal layers comprises:
    thickness greater than thickness of at least one other metal layers of the plurality of metal layers.

5. The on-chip differential multiple layer inductor of claim 1 further comprises:
    a center tap coupled to the multi-layer winding such that the multi-layer winding is symmetrical about the center tap with respect to the first and second nodes.

* * * * *